(12) United States Patent
Choi et al.

(10) Patent No.: US 8,013,349 B2
(45) Date of Patent: Sep. 6, 2011

(54) LIGHT EMITTING DEVICE AND METHOD OF MANUFACTURING THE SAME

(75) Inventors: Seung Tae Choi, Yongin-si (KR); Hyun Soo Kim, Yongin-si (KR); Jin Seung Choi, Yongin (KR); Suk Jin Ham, Yongin-si (KR); Ki Hwan Kwon, Yongin-si (KR); Chang Youl Moon, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 891 days.

(21) Appl. No.: 11/599,391

(22) Filed: Nov. 15, 2006

(65) Prior Publication Data

US 2008/0023687 A1 Jan. 31, 2008

(30) Foreign Application Priority Data

Jul. 31, 2006 (KR) .................. 10-2006-0072176

(51) Int. Cl.
*H01L 33/00* (2010.01)
(52) U.S. Cl. ............... 257/91; 257/99; 257/E33.065
(58) Field of Classification Search .......... 257/91, 257/99
See application file for complete search history.

(56) References Cited

U.S. PATENT DOCUMENTS

| 6,087,194 | A * | 7/2000 | Matsukura et al. | 438/25 |
| 6,919,641 | B2 * | 7/2005 | Onozawa et al. | 257/777 |
| 2003/0100140 | A1 | 5/2003 | Lin et al. | |

FOREIGN PATENT DOCUMENTS

| JP | 2005-79551 A | 3/2005 |
| KR | 10-2001-0079490 A | 8/2001 |
| KR | 2004-0013394 A | 2/2004 |
| KR | 2005-0013989 A | 2/2005 |
| KR | 10-2005-0070459 A | 7/2005 |
| KR | 10-2006-0041383 A | 5/2006 |
| KR | 10-2007-0002935 | 1/2007 |

OTHER PUBLICATIONS

Mechanics of laser-assisted debonding of films, P.R. Tavernier and D.R. Clarke, Journal of Applied Physics, Feb. 1, 2001, vol. 89, No. 3, Santa Barbara. California, pp. 1527-1536.

High-power GaN light-emitting diodes with patterned copper substrates by electroplating, R.H. Horng, C.E. Lee, S.C. H. Huang, C.C. Wu, C.Y. Kung, and D.S. Wuu, published online Sep. 15, 2004, pp. 2786-2790.

High-Power GaN-Mirror-Cu Light-Emitting Diodes for Vertical Current Injection Using Laser Liftoff and Eletroplating Techniques, W.Y. Lin, D.S. Wuu, K.F. Pan, S.H. Huang, C.E. Lee, W.K. Wang, S.C. HSU, Y.Y. SU, S.Y. Huang and R.H. Horng, IEEE Photonics Technology Letters, vol. 17, No. 9, Sep. 2005, pp. 1809-1811.

* cited by examiner

*Primary Examiner* — Jerome Jackson, Jr.
(74) *Attorney, Agent, or Firm* — Sughrue Mion, PLLC

(57) ABSTRACT

A method of manufacturing a light emitting device includes: forming a plurality of independent light emitting portions on a growth substrate; separating the light emitting portions from the growth substrate; mounting the light emitting portions onto a receiving substrate; and dicing the receiving substrate, onto which the light emitting portions are mounted, into a light emitting unit. Residual stress, which occurs when the light emitting portions are separated from the substrate, can be reduced, and the light emitting portions can be mounted onto the receiving substrate in a fluid state, whereby the light emitting device can be easily mass produced with excellent quality, and its manufacturing costs can be reduced.

9 Claims, 10 Drawing Sheets

LIGHT EMITTING DEVICE AND METHOD OF MANUFACTURING THE SAME

CROSS-REFERENCE TO RELATED APPLICATIONS

This application claims priority from Korean Patent Application No. 2006-0072176, filed on Jul. 31, 2006, in the Korean Intellectual Property Office, the disclosure of which is incorporated herein by reference.

BACKGROUND OF THE INVENTION

1. Field of the Invention

Methods and apparatuses consistent with the present invention relate to the manufacturing of light emitting devices, and more particularly, to a method of manufacturing light emitting devices, which enables mass production of the light emitting devices while providing high quality and reducing manufacturing costs.

2. Description of the Related Art

Incandescent lamps occupy a large segment of the lamp market. Incandescent lamps emit light of a desired color from among various desired colors by using a filter, for example, in the brake lamp of a car or a traffic light, which requires light of only a single color. In this case, since energy is spent generating unnecessary colors, energy efficiency is greatly reduced.

A light emitting diode (LED), which was introduced in the 1960's, emits light of a single desired color. Accordingly, energy is not spent generating unnecessary colors and energy efficiency can be enhanced. Until recently, LED use has been limited to display lamps or other display devices. However, the LED is now widely used as an interior lamp and a brake lamp of a car, a traffic light, an outdoor electric sign, and a backlight lamp of a cellular phone or PDA, since highly efficient AlGaInP (red) and GaInN (green) LEDs grown by a metal organic chemical vapor deposition (MOCVD) process were developed.

Accordingly, mass production of LEDs is required. However, there are several difficulties in mass production of the LED, and in the course of manufacturing the LED.

Specifically, when a compound semiconductor is separated from a growth substrate of a single crystal in the course of manufacturing an LED, a crack may occur in the compound semiconductor due to factors such as a lattice defect and a difference in thermal expansion coefficients between the compound semiconductor and the growth substrate, whereby production efficiency may be deteriorated.

For example, a GaN substrate can generally be manufactured by using an $Al_2O_3$ substrate as a growth substrate. However, if a GaN layer is formed on the $Al_2O_3$ substrate, a crystalline defect of high density may occur due to the difference in lattice constants and thermal expansion coefficients between the GaN layer and the $Al_2O_3$ substrate. Therefore, a crack occurs in the GaN layer when the GaN layer is being separated from the $Al_2O_3$ substrate. Accordingly, production efficiency of the GaN layer may be deteriorated and the quality of the product may also be deteriorated.

In recent manufacturing methods, the GaN layer is separated from the $Al_2O_3$ substrate by a laser lift off process which includes irradiating a laser to a transparent $Al_2O_3$ substrate after growing the GaN layer on the $Al_2O_3$ substrate, and melting a surface portion between the GaN layer and the $Al_2O_3$ substrate. However, it is difficult to handle the GaN layer separated by the laser lift off process because such a GaN layer is very thin. Also, as described above, it is likely that the thin GaN layer may be broken due to the difference in thermal expansion coefficients and lattice constants between the GaN layer and the $Al_2O_3$ substrate when the GaN layer is being separated from the $Al_2O_3$ substrate. For this reason, the crack which occurs in the course of separating the GaN layer from the $Al_2O_3$ substrate is adverse to mass production and manufacturing cost, and deteriorates production efficiency.

Accordingly, a light emitting device and a method of manufacturing the same, which enables mass production while providing high quality, and can remarkably reduce manufacturing costs is required.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

The present invention provides a light emitting device and a method of manufacturing the same, in which the light emitting device can be easily manufactured with excellent quality.

The present invention also provides a light emitting device and a method of manufacturing the same, in which the light emitting device is manufactured quickly and easily to facilitate mass production, and the unit manufacturing costs are reduced.

The present invention also provides a light emitting device and a method of manufacturing the same, which can reduce a defect when a light emitting portion grown from a parent material is separated from the parent material.

The present invention also provides a light emitting device and a method of manufacturing the same, which can emit various kinds of light.

Additional aspects of the invention will be set forth in part in the description which follows and, in part, will be apparent from the description, or may be learned by practice of the invention.

According to an aspect of the present invention, a method of manufacturing a light emitting device includes: forming a plurality of independent light emitting portions on a growth substrate; separating the light emitting portions from the growth substrate; mounting the light emitting portions onto a receiving substrate; and dicing the receiving substrate onto which the light emitting portions are mounted, into light emitting units.

In the forming of the plurality of independent light emitting portions on a growth substrate, the light emitting portions are grown from the growth substrate, and a single crystal substrate is used as the growth substrate.

Generally, crystals are divided into a single crystal, a polycrystal, and an amorphous crystal, wherein motion of electrons is actively made in the single crystal. A single crystal substrate is used as the growth substrate to manufacture the light emitting portions. At this time, various substrates of GaN, MgO, Si, and $Al_2O_3$ may be used as the single crystal substrate. Recently, $Al_2O_3$ is widely used as a substrate for forming a GaN compound semiconductor.

In order to form the light emitting portions, an epitaxial layer which includes an n type semiconductor layer, an active layer and a p type semiconductor layer can first be formed on the single crystal substrate.

After the epitaxial layer is formed on the growth substrate, the epitaxial layer undergoes isolation on a surface of the growth substrate at a predetermined size to provide a plurality of independent light emitting patterns. In this case, the light emitting portions include n type semiconductor patterns, active patterns, and p type semiconductor patterns, which are independently formed by isolation of the epitaxial layer.

After the light emitting portions are formed from the growth substrate, they can be separated from the growth substrate by either laser irradiation or a chemical method. After the light emitting patterns are provided by isolation of the epitaxial layer from the growth substrate, since they are divided into small light emitting portions of less than 300 micrometers, a crack of the light emitting patterns, which may occur when the epitaxial layer is separated from the growth substrate, can be prevented or minimized.

The light emitting portions separated from the growth substrate by the aforementioned method are mounted onto the receiving substrate. At this time, in order to mount the light emitting portions onto the receiving substrate, each of the light emitting portions may include a protrusion and the receiving substrate may be provided with recesses, each of which corresponds to the protrusion respectively.

The receiving substrate provides a receptor substrate and recesses which correspond to the protrusions. For example, after mask patterns are formed on the receptor substrate except portions which correspond to the protrusions, the receptor substrate can be etched to form the recesses which correspond to the protrusions. The mask patterns are then removed so as to complete the receiving substrate.

Accordingly, in the mounting of the light emitting portions onto the receiving substrate, the light emitting portions can be mounted onto the recesses which correspond to the protrusions. At this time, the light emitting portions which include the protrusions are provided in a fluid state so that they can be mounted onto the receiving substrate which includes the recesses which corresponds to the protrusions. Also, the protrusions can be provided in one shape selected from among predetermined shapes, and the recesses can be provided in one shape selected from among predetermined shapes to correspond to the protrusions. For example, recesses which have different shapes such as square, circle, T-shape, and L-shape may be formed on one receiving substrate, and the protrusions of the light emitting portions can be formed in a shape to be inserted into each recess. Accordingly, when the light emitting portions can be mounted onto the recesses by using the protrusions, the light emitting portions can be arranged on the receiving substrate depending on a designer's desired position. In this way, each light emitting portion can be selectively mounted onto the receiving substrate according to RGB colors.

At this time, the protrusions are to mount the light emitting portions onto the receiving substrate provided with the recesses. Another physical means may be used to mount the light emitting portions onto the receiving substrate depending upon exemplary embodiments. Alternatively, the light emitting portions may be mounted onto the receiving substrate by a chemical or electrical method in which attraction can work.

After the light emitting portions are mounted onto the receiving substrate, the receiving substrate onto which the light emitting portions are mounted is diced into light emitting units, whereby the light emitting device is completed. The light emitting unit may include one or more light emitting portions depending on a manufacturer's intention.

The light emitting device manufactured by the aforementioned method includes light emitting portions and a receiving substrate. The light emitting portions include protrusions protruded from one side of the light emitting portions, and the receiving substrate includes a receptor substrate and recesses, wherein the recesses are formed in the receptor substrate to correspond to the protrusions. The light emitting device is formed such that the protrusions are bonded to the recesses and the receiving substrate is diced into a light emitting unit.

In this case, the protrusions are to mount the light emitting portions onto the receiving substrate provided with the recesses. Another physical means may be used to mount the light emitting portions onto the receiving substrate depending upon the exemplary embodiments. Alternatively, the light emitting portion may be mounted onto the receiving substrate by a chemical or electrical method in which attraction can work.

After the light emitting portions are mounted onto the receiving substrate, the receiving substrate onto which the light emitting portions are mounted is diced to form a plurality of light emitting units or sets, which may include at least one light emitting portion as a set. Namely, the light emitting unit may include one or more light emitting portions depending on a manufacturer's intention.

BRIEF DESCRIPTION OF THE DRAWINGS

These and/or other aspects of the invention will become apparent and more readily appreciated from the following description of the exemplary embodiments, taken in conjunction with the accompanying drawings of which.

DETAILED DESCRIPTION OF EXEMPLARY EMBODIMENTS OF THE INVENTION

Figure 1:
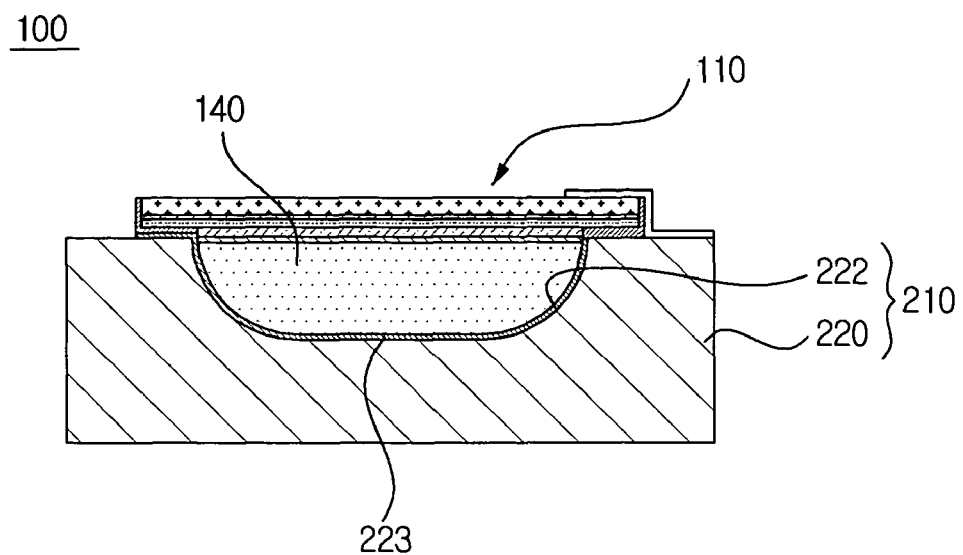
FIG. 1 is a cross-sectional view illustrating a light emitting device according to a first exemplary embodiment of the present invention.

Reference will now be made in detail to the exemplary embodiments of the present invention, examples of which are illustrated in the accompanying drawings, wherein like reference numerals refer to the like elements throughout. The exemplary embodiments are described below to explain the present invention by referring to the figures. Although the exemplary embodiments are numbered for easier understanding in these descriptions, the numbers do not indicate any order of preference regarding the exemplary embodiments.

Embodiment 1

FIG. 1 is a cross-sectional view illustrating a light emitting device according to a first exemplary embodiment of the present invention.

Referring to FIG. 1, a light emitting device 100 includes a light emitting portion 110 and a receiving substrate 210. The light emitting portion 110 includes a protrusion 140 which protrudes from one side of the light emitting portion 110, and the receiving substrate 210 includes a receptor substrate 220 and a recess 222, wherein the recess 222 is formed in the receptor substrate 220 to correspond to the protrusion 140. The light emitting device 100 is formed such that the protrusion 140 is bonded to the recess 222 and the receiving substrate 210 is diced into light emitting unit. The light emitting unit may include one or more light emitting portions as a set.

The protrusion 140 is used to mount the light emitting portion 110 onto the receiving substrate 210 provided with the recess 222. Another physical means may be used to mount the light emitting portion 110 onto the receiving substrate 210 depending upon the exemplary embodiments. Alternatively, the light emitting portion may be mounted onto the receiving substrate 210 by a chemical or electrical method in which attraction can work.

Furthermore, either one of Cr, Ti, Cu, Ni, Au, Ag, Sn, PnSn, AuSn, SnAgCu, and CuAg, or an alloy thereof may be used as a material for the protrusion 140. Any one of the protrusion 140 and an electrode pattern 223 on the recess 222 or both the protrusion 140 and the electrode pattern 223 may be formed of a material that enables soldering. As will be described later, the protrusion 140 may be bonded to the electrode pattern 223 on the recess 222 by heat after being mounted onto the recess 222.

After the light emitting portion 110 is mounted onto the receiving substrate 210, the receiving substrate 210 is diced into a light emitting unit, and the construction of the light emitting device 100 is completed. In this exemplary embodiment of the present invention, although the light emitting unit of the light emitting device 100 includes one light emitting portion 110, it may include two or more light emitting portions depending on a manufacturer's intention, by dicing the receiving substrate.

A method of manufacturing the light emitting device 100 according to the exemplary embodiment of the present invention includes the steps of forming a plurality of light emitting portions 110 on a growth substrate, separating the light emitting portions from the growth substrate, mounting the light emitting portions 110 onto a receiving substrate 210, and dicing the receiving substrate 210, onto which the light emitting portions 110 are mounted, in light emitting units.

Hereinafter, a method of manufacturing a light emitting portion will be described in detail.

FIG. 2 to FIG. 9 are cross-sectional views sequentially illustrating process steps of manufacturing the light emitting device of FIG. 1 and process steps of manufacturing the light emitting portion to describe the light emitting device.

Referring to FIG. 2 to FIG. 9, each of the light emitting portions 110 includes a light emitting pattern 130 and a protrusion 140.

In the forming of a plurality of light emitting portions 110 on a growth substrate 10, the light emitting portions 110 are grown from the growth substrate 10, and a single crystal substrate is used as the growth substrate 10.

Generally, crystals are divided into a single crystal, a polycrystal, and an amorphous crystal, wherein motion of electrons is most active in the single crystal. The single crystal substrate is used as the growth substrate to manufacture the light emitting portions 110. At this time, various substrates of GaN, MgO, Si, and $Al_2O_3$ may be used as the single crystal substrate. Recently, $Al_2O_3$ is widely used as a substrate for forming a GaN compound semiconductor.

Figure 2:
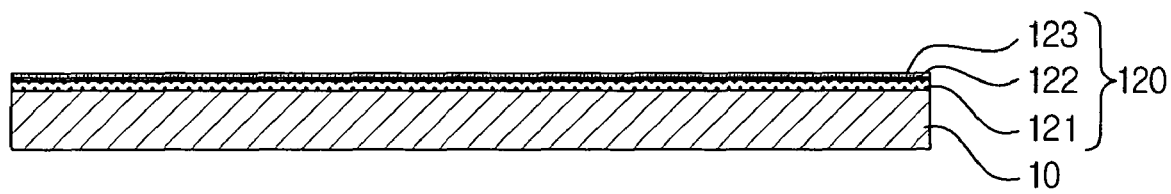
FIG. 2 to FIG. 9 are cross-sectional views sequentially illustrating process steps of manufacturing the light emitting device of FIG. 1 and process steps of manufacturing light emitting portions to describe the light emitting device.

As shown in FIG. 2, in order to form the light emitting portions 110, an epitaxial layer 120, which sequentially includes an n type semiconductor layer 121, an active layer 122 and a p type semiconductor layer 123, is first formed on the growth substrate 10.

Figure 3:
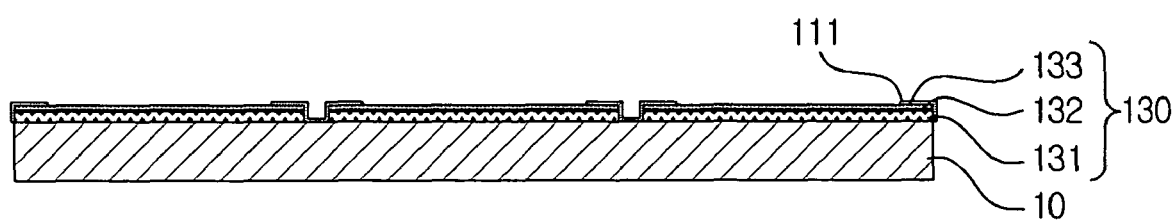

As shown in FIG. 3, after the epitaxial layer 120 is formed on the growth substrate 10, the epitaxial layer 120 undergoes isolation on a surface of the growth substrate 10 at a predetermined size to provide a plurality of independent light emitting patterns 130.

Accordingly, the light emitting portions 110 include n type semiconductor patterns 131, active patterns 132, and p type semiconductor patterns 133, which are independently formed by isolation of the epitaxial layer 120. After the light emitting patterns 130 are formed at a desired size, each corner of the light emitting patterns 130 may be provided with an oxide based passivation 111. At this time, upper surfaces of the light emitting patterns 130 are partially exposed.

Figure 4:
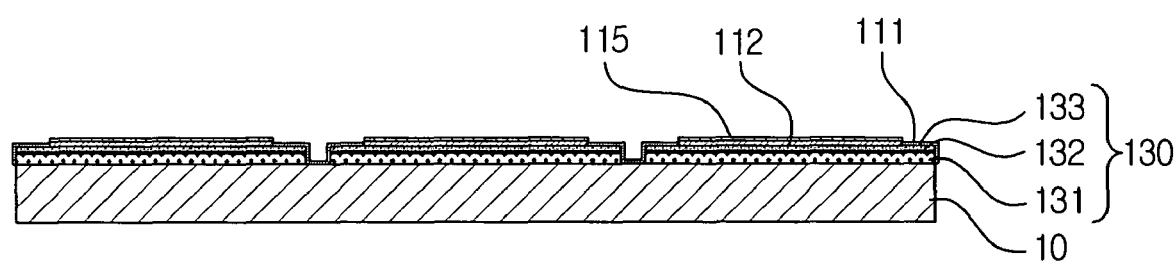

As shown in FIG. 4, after the light emitting patterns 130 and the passivations 111 are formed, mirror patterns 112 are formed on the exposed upper surfaces of the light emitting patterns 130 where the passivations 111 are not formed, so as to reflect light. The mirror patterns 112 can be formed by plating or deposition. After the mirror patterns 120 are formed, upper electrode patterns 115 are formed on the mirror patterns 112, wherein P-metal electrodes are used as the upper electrode patterns 115.

Figure 5:
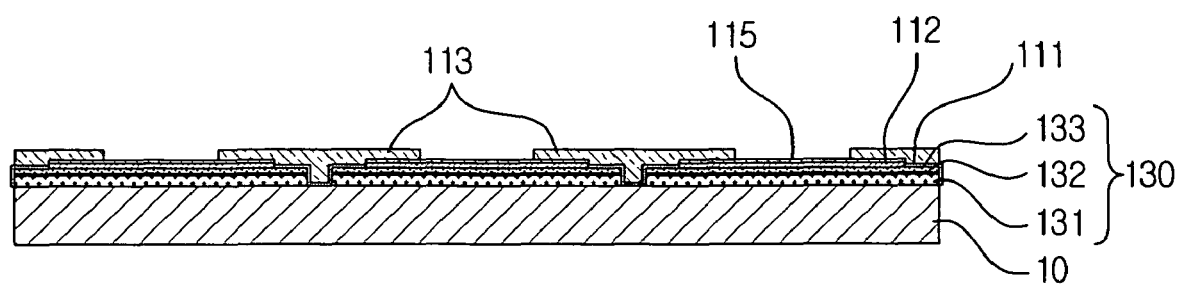
Figure 6:
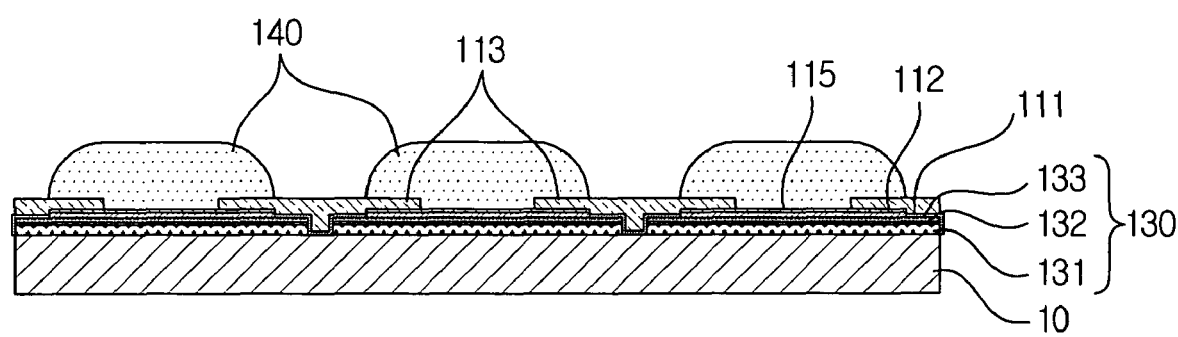

As shown in FIG. 5, mask patterns 113 are formed in the periphery of the mirror patterns 112 except the upper electrode patterns 115. In this exemplary embodiment of the present invention, photoresist (PR) may be used as the mask patterns 113. After the mask patterns 113 are formed, as shown in FIG. 6, protrusions 140 are formed on the light emitting patterns 130.

Figure 7:
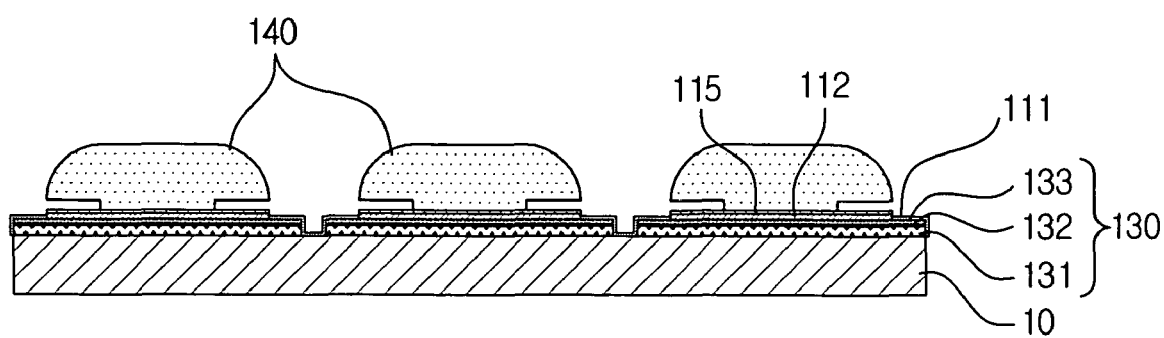

The PR is a photosensitive polymer responsive to light if it is exposed to light of a specific wavelength. The response of the PR means that polymer chains of an exposed portion of the PR are cut or firmly connected with one another when the PR is partially exposed. The exposed portion of the PR where the polymer chains are cut is referred to as a positive PR, and the exposed portion of the PR where the polymer chains are firmly connected with one another is referred to as a negative PR. In this exemplary embodiment of the present invention, as shown in FIG. 7, after the protrusions 140 are formed using the mask patterns 113 of the positive PR, the PR coating, i.e., the mask patterns 113 can be removed.

Figure 8:
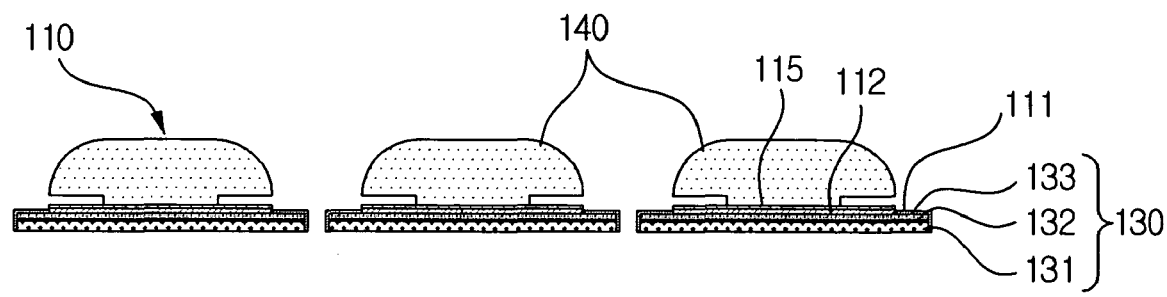
Figure 9:
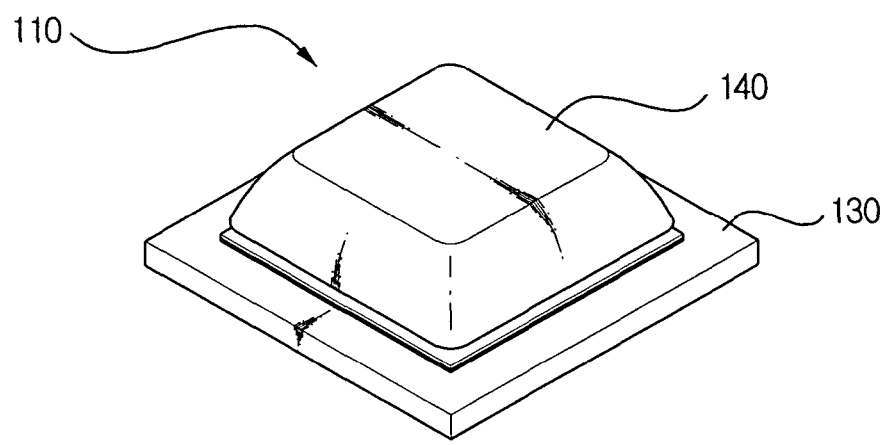

The plurality of light emitting portions 110 formed as described above are separated from the growth substrate 10. FIG. 8 illustrates each of the light emitting portions separated from the growth substrate 10, and FIG. 9 is a perspective view illustrating a separate light emitting portion 110.

After the light emitting portions 110 are formed from the growth substrate 10, the light emitting portions 110 can be separated from the growth substrate 10 by laser irradiation or a chemical method. According to the exemplary embodiment of the present invention, the epitaxial layer 120 is divided into a plurality of light emitting patterns 130 on the growth substrate 10, and the mirror patterns 112, the upper electrode patterns 115, and the passivations 111 are then formed to complete the light emitting portions 110. Next, since the light emitting portions 110 are separated from the growth substrate by a small interval, a crack of the light emitting portions 110 can be prevented or minimized in comparison with a related art method of manufacturing separate light emitting portions by dicing a large sized wafer.

Hereinafter, a method of manufacturing the receiving substrate onto which the light emitting portions are mounted will be described in detail.

Figure 10:
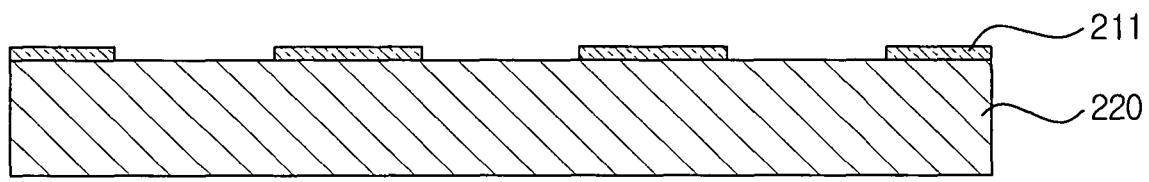
FIG. 10 to FIG. 12 are cross-sectional views illustrating process steps of manufacturing a receiving substrate according to the first exemplary embodiment of the present invention.
Figure 11:
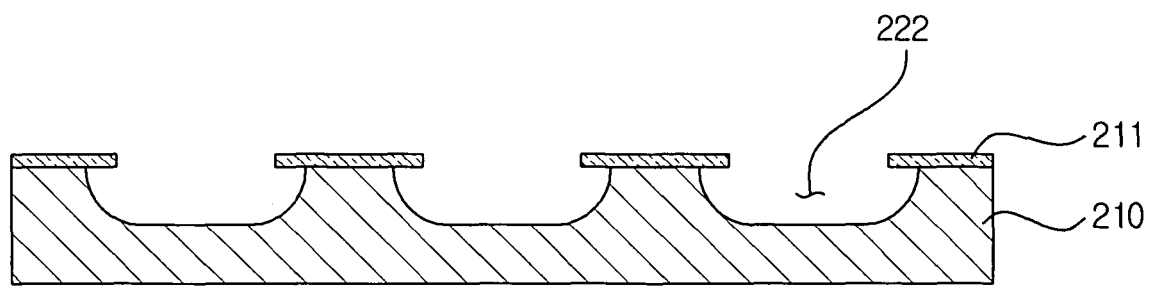
Figure 12:
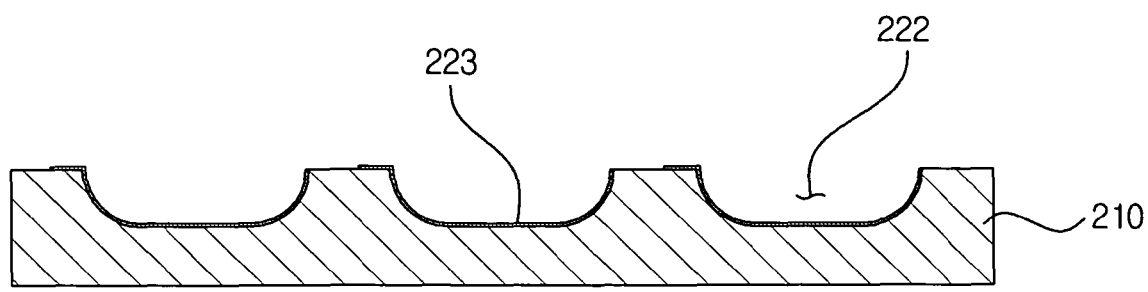

FIG. 10 to FIG. 12 are cross-sectional views illustrating process steps of manufacturing a receiving substrate according to the first exemplary embodiment of the present invention.

Referring to FIG. 10 to FIG. 12, in order to provide a receiving substrate 210, a flat receptor substrate 220 is provided as shown in FIG. 10, and mask layers 211 are formed on the receptor substrate 220 except portions corresponding to the protrusions 140 of the aforementioned light emitting portions 110. In this exemplary embodiment of the present invention, the photoresist which is the same as that of the aforementioned mask patterns 113, can be used as the mask layers 211. After the mask layers 211 are formed, as shown in FIG. 11, recesses 222 which corresponds to the protrusions 140 are formed on the receptor substrate 220. As shown in FIG. 12, the mask layers 211 are removed to complete the receiving substrate 210. Also, transfer electrode patterns 223 are formed on surfaces of the recesses 222. For reference, either one of Zn, Ni, Ag, Cu, Ti, Pt, Au, Sn, PbSn, AuSn, SnAgCu and CuAg, or an alloy thereof can be used as a material of the transfer electrode patterns 223.

Hereinafter, a method for mounting the light emitting portions onto the receiving substrate will be described in detail.

FIG. 13 to FIG. 16 are cross-sectional views illustrating process steps of manufacturing a light emitting device by mounting the light emitting portions onto the receiving substrates and dicing the receiving substrate.

Referring to FIG. 13 to FIG. 16, the protrusions 140 formed in the light emitting portions 110 are mounted onto the recesses 222 formed on the receiving substrate 210.

Figure 13:
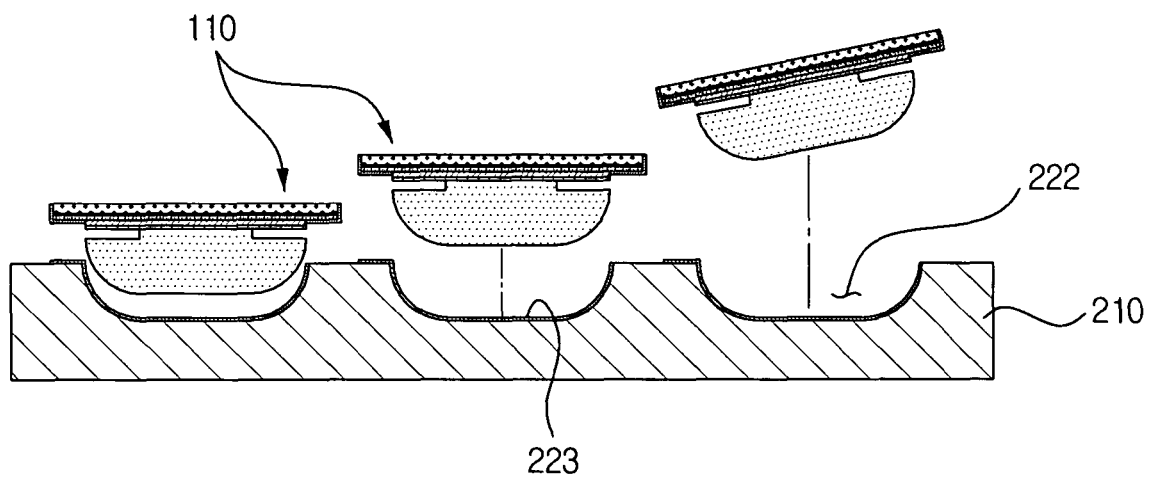
FIG. 13 to FIG. 16 are cross-sectional views illustrating process steps of manufacturing a light emitting device by mounting the light emitting portions onto the receiving substrate and dicing the receiving substrate.

When the light emitting portions 110 are mounted onto the receiving substrate 210, they can be mounted onto the recesses 222 corresponding to the protrusions 140 formed in the light emitting portions 110. At this time, as shown in FIG. 13, the plurality of light emitting portions 110 including the protrusions 140 are provided in a fluid state, so that the light emitting portions 110 can be mounted onto the receiving substrate 210 including the recesses 222 corresponding to the protrusions 140.

Furthermore, in this exemplary embodiment of the present invention, although the protrusions 140 are formed to have a uniform shape, they may be formed to have one of a number of predetermined shapes. Also, the protrusions may be mounted onto their corresponding recesses only, so that the light emitting portions can be mounted automatically in accordance with a predetermined arrangement.

At this time, the protrusions are to mount the light emitting portions onto the receiving substrate provided with the recesses. Another physical means may be used to mount the light emitting portions onto the receiving substrate depending upon the exemplary embodiments. Alternatively, the light emitting portions may be mounted onto the receiving substrate by a chemical or electrical method in which attraction can work.

Figure 14:
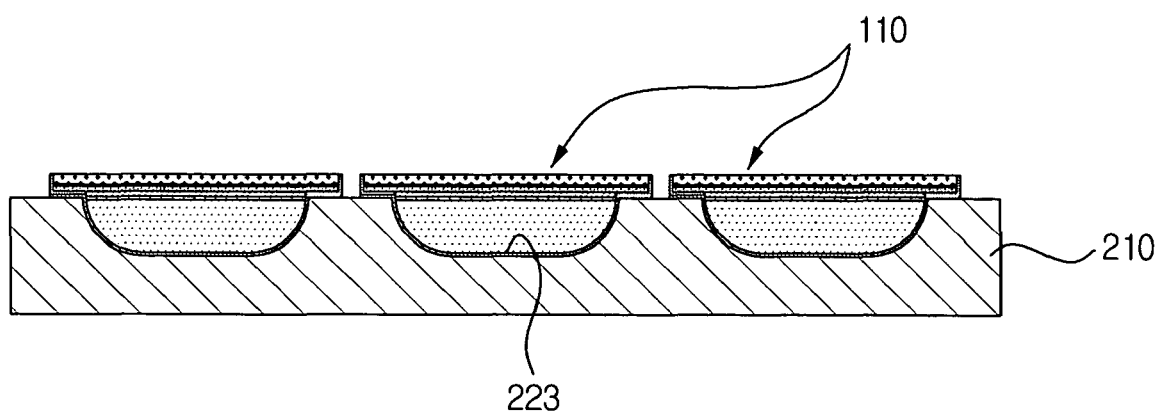

As shown in FIG. 14, after the light emitting portions are mounted onto the receiving substrate, and the protrusions 140 may be bonded to the recesses 222 by heat. Either any one of the protrusions 140 and the electrode patterns 223 or the protrusions 140 and the electrode patterns 223 may serve as solder portions and may be formed of any one of PnSn, AuSn, SnAgCu and CuAg. The protrusions 140 may be bonded to N-metal electrodes by heat to form a single body.

Figure 15:
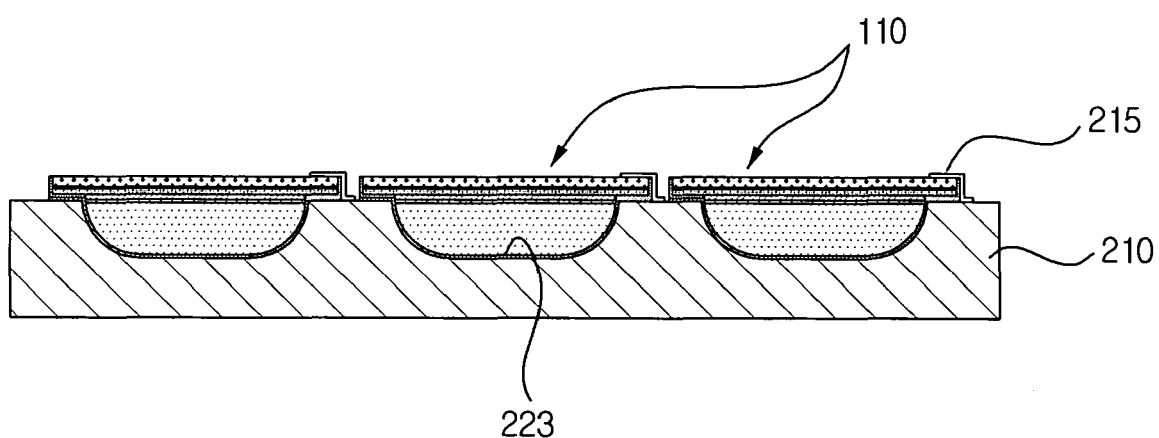

As shown in FIG. 15, lower electrode patterns 215 are formed in the light emitting portions 110 mounted onto the receiving substrate. At this time, N-metal electrodes are used as the lower electrode patterns 215. For reference, a metal or a transparent electrode may be used as the lower electrode patterns 215. An indium tin oxide (ITO) or indium zinc oxide (IZO) having conductivity or transmittance may be used as the transparent electrode.

Figure 16:
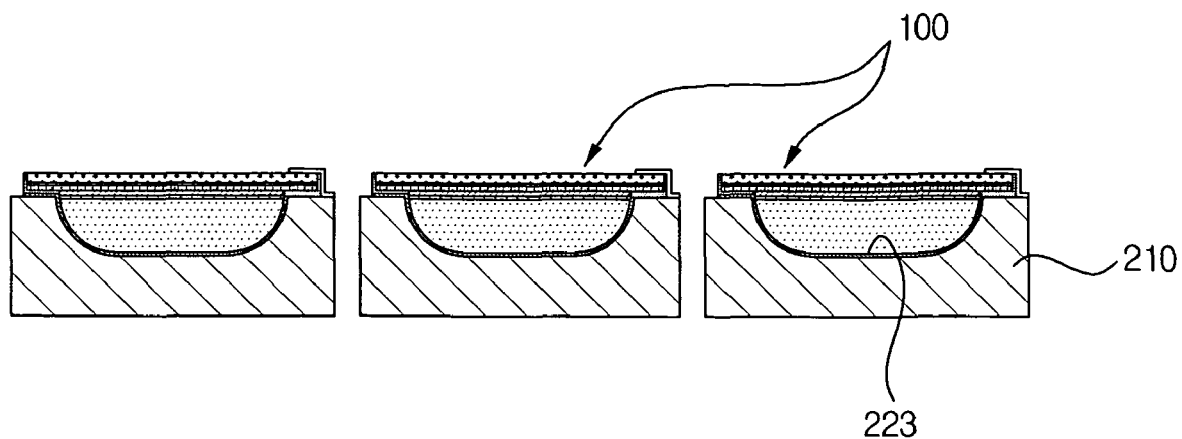

Finally, as shown in FIG. 16, after the light emitting portions 110 are mounted onto the receiving substrate 210, the receiving substrate 210 onto which the light emitting portions 110 are mounted is diced into a light emitting unit, whereby the construction of the light emitting device 100 can be completed. In this exemplary embodiment of the present invention, although the light emitting unit of the light emitting device 100 includes one light emitting portion 110, it may include two or more light emitting portions depending on a manufacturer's intention by dicing the receiving substrate.

Embodiment 2

Figure 17:
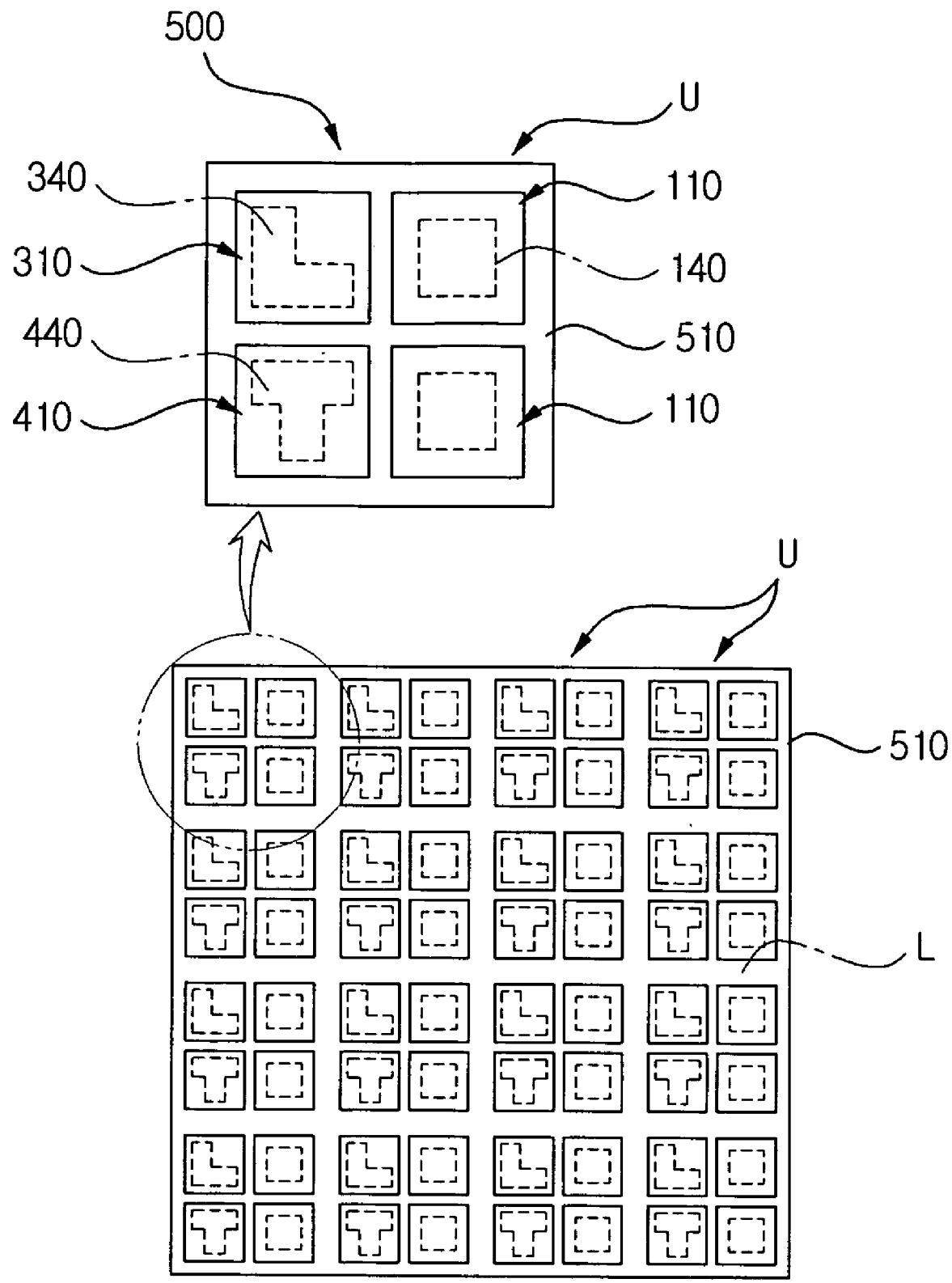
FIG. 17 is a front view illustrating a light emitting device and a method of manufacturing the same according to a second exemplary embodiment of the present invention.

FIG. 17 is a front view illustrating a light emitting device and a method of manufacturing the same according to a second exemplary embodiment of the present invention.

Referring to FIG. 17, a light emitting device 500 according to the second exemplary embodiment of the present invention includes light emitting portions 110, 310, and 410 which have protrusions of different shapes, and a receiving substrate 510.

The light emitting device 500 according to the second exemplary embodiment of the present invention has a light emitting unit which comprises four light emitting portions. Specifically, the two light emitting portions 110 are the same as those of the first exemplary embodiment. The other two light emitting portions 310 and 410 include L-shaped and T-shaped protrusions 340 and 440 which are different from those of the light emitting portions 110 according to the first exemplary embodiment. However, the light emitting portions 310 and 410 which have the L-shaped and T-shaped protrusions 340 and 440 are manufactured in substantially the same manner as that of the light emitting portion 110 according to the first exemplary embodiment. The light emitting portions 310 and 410 and the method of manufacturing the same will be described with reference to the light emitting portions and the method of manufacturing the same according to the first exemplary embodiment, and technical contents previously described will be omitted for clarity.

First, after the light emitting portions 110, 310, and 410 which have different shaped protrusions are provided in a fluid state and then mounted onto the receiving substrate 510, the receiving substrate 510 is diced into a light emitting unit U along a cut line L, so that the construction of the light emitting device 500 can be completed. Although the light emitting unit may include one or more light emitting portions depending on a manufacturer's intention, in this exemplary embodiment, the receiving substrate is diced along the cut line L to provide the light emitting unit U having four light emitting portions 110, 310 and 410.

As the light emitting portions 110, 310, and 410 are provided with different protrusions 140, 340, and 440, they can be mounted onto recesses which correspond to the shapes of the protrusions 140, 340 and 440.

The protrusions 140, 340, and 440 are used to mount the light emitting portions onto the receiving substrate provided with the recesses. Another physical means may be used to mount the light emitting portions onto the receiving substrate depending upon the exemplary embodiments. Alternatively, the light emitting portions may be mounted onto the receiving substrate by a chemical or electrical method in which attraction can work.

After the light emitting portions 110, 310 and 410 are mounted onto the receiving substrate 510, the receiving substrate 510 is diced into the light emitting unit, whereby the construction of the light emitting device 500 is completed. The light emitting unit may include one or more light emitting portions depending on a manufacturer's intention.

Figure 19:
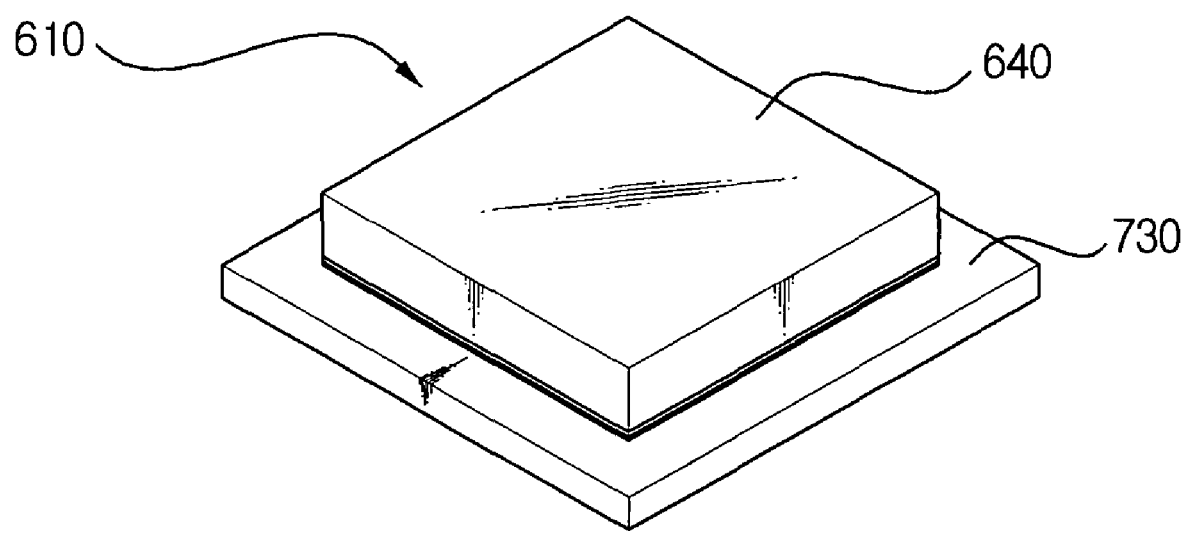
FIG. 19 is an enlarged perspective view illustrating a light emitting portion according to the third exemplary embodiment of the present invention.

Accordingly, the light emitting device of the related art which was used to emit light of only a single color, can also emit light of various colors. Specifically, after light emitting patterns are formed by using any one of GaP, GaAsP, AlGaAs, and AlGaInP, which are used to manufacture a red LED, and other light emitting patterns are formed by using any one of GaP, AlGaInP, and InGaN, which are used to manufacture a yellow LED, the light emitting portion 410 having the T-shaped protrusion 440 can be formed. Also, IV group semiconductor such as SiC, II-VI group semiconductor such as ZnSe and ZnS, and III-V group semiconductor such as GaN may be used as a material to manufacture a blue LED. Recently, GaN based material is mainly used to manufacture the blue LED. Accordingly, the light-emitting patterns can be formed of the aforementioned material, and the light emitting portions 110 which have square protrusions like those of the first exemplary embodiment can be formed. At this time, as shown in FIG. 19, the light emitting portions which have different protrusions are mounted onto their corresponding recesses formed in the receiving substrate 510. The light emitting device can be completed by dicing the receiving substrate into a desired light emitting unit of a manufacturer.

Embodiment 3

Figure 18:
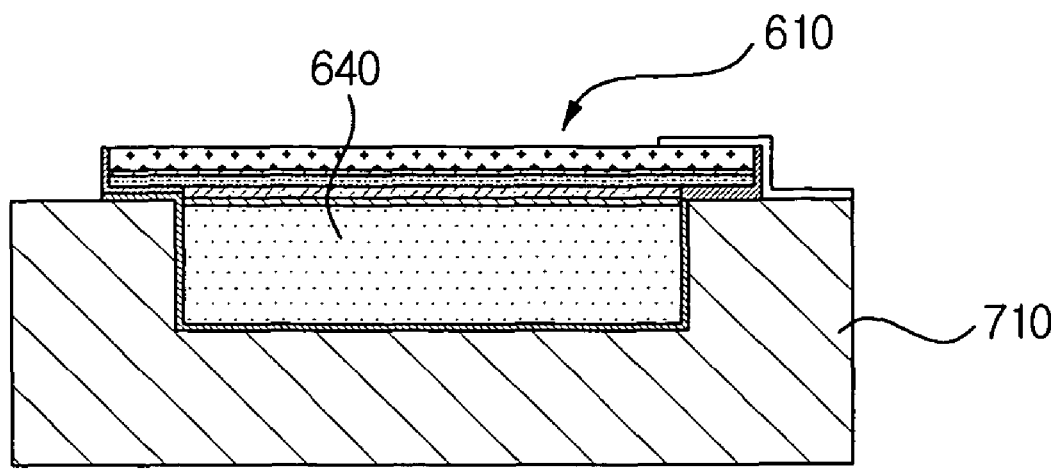
FIG. 18 is a cross-sectional view illustrating a light emitting device according to a third exemplary embodiment of the present invention.

FIG. 18 is a cross-sectional view illustrating a light emitting device according to a third exemplary embodiment of the present invention, and FIG. 19 is an enlarged perspective view illustrating a light emitting portion according to the third exemplary embodiment of the present invention.

Referring to FIGS. 18 and 19, a light emitting device 600 according to the third exemplary embodiment of the present invention includes a light emitting portion 610 and a receiving substrate 710. The light emitting portion 610 includes a protrusion 640 which protrudes from one side of the light emitting portion 610, and the receiving substrate 710 includes a receptor substrate and a recess, wherein the recess is formed in the receptor substrate to correspond to the protrusion 640. The light emitting device 600 is formed such that the protrusion 640 is bonded to the recess and the receiving substrate 710 is diced into a light emitting unit.

The light emitting device and the method of manufacturing the same according to the third exemplary embodiment are substantially the same as those of the first exemplary embodiment. Accordingly, the light emitting portion and the method of manufacturing the same according to the third exemplary embodiment will be described with reference to those of the first exemplary embodiment, and their repeated description will be omitted.

In the third exemplary embodiment of the present invention, the protrusion formed in the light emitting portion is different from the first exemplary embodiment. To this end, when the protrusion is formed, a photoresist layer has a thickness greater than a desired thickness of the protrusion, and the protrusion can be formed in the photoresist layer to have a square pillar shape. Also, a recess is etched by anisotropic etching to correspond to the square pillar shaped protrusion. As a result, the recess can have a shape which corresponds to the square pillar shaped protrusion.

The light emitting device and the method of manufacturing the same according to the exemplary embodiments of the present invention have the following advantages.

A light emitting device which has excellent quality can be easily manufactured by the method according to the exemplary embodiments of the present invention.

Also, since the plurality of light emitting portions are not individually bonded to the receiving substrate but simultaneously bonded to the receiving substrate, the light emitting device can be manufactured quickly and easily, thereby facilitating mass production and reducing manufacturing costs.

Also, according to the exemplary embodiments of the present invention, it is possible to reduce a defect when the light emitting portions, which are grown from the growth substrate, are separated from the growth substrate.

Also, according to the exemplary embodiments of the present invention, since the light emitting device is provided in the light emitting unit which has various light emitting portions, the light emitting device can emit light of various colors.

Finally, since the small sized light emitting portion is assembled into the receiving substrate, excellent radiation performance can be obtained.

Although a few exemplary embodiments of the present invention have been shown and described, it would be appreciated by those skilled in the art that changes may be made in these exemplary embodiments without departing from the principles and spirit of the invention, the scope of which is defined in the claims and their equivalents.

What is claimed is:
1. A light emitting device comprising:
a light emitting unit comprising a plurality of light emitting portions including a plurality of light emitting patterns and protrusions, of different shapes, protruded from the light emitting patterns; and
a receiving substrate including recesses formed to correspond to the shapes of the protrusions,
wherein the recesses are bonded to the protrusions, and
wherein the protrusions are formed of materials different from the light emitting patterns.
2. The light emitting device of claim 1, wherein the receiving substrate includes a plurality of recesses provided in one shape selected from among predetermined shapes, and the protrusions are provided in one shape selected from among predetermined shapes to correspond to the recesses and thus to be selectively bonded to the recesses.
3. The light emitting device of claim 1, wherein the light emitting patterns include n type semiconductor patterns, active patterns, and p type semiconductor patterns, which are formed on a growth substrate.
4. A light emitting device comprising:
a light emitting unit comprising a plurality of light emitting portions including protrusions, of different shapes, protruded from one side of each of the light emitting portions; and
a receiving substrate including a recesses formed to correspond to the shapes of the protrusions,
wherein the protrusions are formed of materials different from an other side, other than the one side, of the light emitting portions.
5. The light emitting device of claim 4, wherein a surface of the recesses are covered with an electrode pattern.
6. The light emitting device of claim 5, wherein the protrusions are bonded to the electrode pattern.

7. The light emitting device of claim 5, wherein at least one of the protrusion and the electrode patterns is formed of a material that enables soldering.

8. The light emitting device of claim 4, wherein at least one of the protrusions is formed in a square pillar shape.

9. The light emitting device of claim 4, wherein the protrusions is are formed of one of Cr, Ti, Cu, Ni, Au, Ag, Sn, PnSn, AuSn, SnAgCu, CuAg, and an alloy thereof.

* * * * *